United States Patent
Yamamoto

[11] Patent Number: 5,313,178
[45] Date of Patent: May 17, 1994

[54] SAW FILTER USING DIFFERENCE FINGER WEIGHTING

[75] Inventor: Yasushi Yamamoto, Tokyo, Japan

[73] Assignee: NEC Corporation, Tokyo, Japan

[21] Appl. No.: 996,141

[22] Filed: Dec. 23, 1992

[30] Foreign Application Priority Data

Dec. 27, 1991 [JP] Japan .................................. 3-346551

[51] Int. Cl.$^5$ .............................................. H03H 9/64
[52] U.S. Cl. ..................................... 333/193; 333/196; 310/313 C
[58] Field of Search ............... 333/183, 194, 195, 196; 310/313 R, 313 B, 313 C, 313 D

[56] References Cited

U.S. PATENT DOCUMENTS

| | | | |
|---|---|---|---|
| 3,754,192 | 8/1973 | Palfreeman | 330/5.5 |
| 4,480,237 | 10/1984 | Yamada | 333/193 |
| 4,558,364 | 12/1985 | Yamada | 358/188 |
| 4,697,115 | 8/1987 | Mitstoshka | 310/313 R |
| 5,107,234 | 4/1992 | Ehrmann-Falkenau et al. | 333/195 |

FOREIGN PATENT DOCUMENTS 1521478 8/1975 United Kingdom.

OTHER PUBLICATIONS

Shigeo Matsu-Ura, et al., "IEEE Transactions on Sonics and Ultrasonics", vol. SU-28, No. 3, May 1981, pp. 156-161.

Primary Examiner—Robert J. Pascal
Assistant Examiner—Darius Gambino
Attorney, Agent, or Firm—Foley & Lardner

[57] ABSTRACT

In a surface acoustic wave filter having a piezoelectric substrate (11) on which an input interdigital transducer (12) and first and second output interdigital transducers (15, 16) are disposed with the output interdigital transducers opposed to the input interdigital transducer apart therefrom, a first output port (17) for the first output interdigital transducer is directly connected to a filter output terminal (20). Between the filter output terminal and a second output port (18) for the second output interdigital transducer, a switch (22) selectively connects the second output port to the filter output terminal to make the filter output terminal produce a filtered output signal which is equal to a sum of at least one of output electric signals supplied from the first and the second output ports. The switch may be a PIN diode or a mechanical switch. The input interdigital transducer may be divided into a plurality of partial input interdigital transducers for supplying a surface acoustic wave to the output interdigital transducers, respectively. The first output interdigital transducer has a primary weighting factor while the second output interdigital transducer has a difference weighting factor.

1 Claim, 6 Drawing Sheets $\Delta W_n = W_{2n} - W_{1n}$

SAW FILTER USING DIFFERENCE FINGER WEIGHTING

BACKGROUND OF THE INVENTION

This invention relates to a surface acoustic wave (SAW) filter and, more particularly, to a surface acoustic wave filter comprising a plurality of output ports.

As well known in the art, a surface acoustic wave filter comprises a piezoelectric substrate on which an input interdigital transducer and a plurality of output interdigital transducers are disposed with the input interdigital transducer opposed to the output interdigital transducers. The input interdigital transducer is connected to an input port while the output interdigital transducers are connected to a plurality of output ports, respectively. The output interdigital transducers have weighting factors which are different from one another.

Such a surface acoustic wave filter is, for example, disclosed in an article which is contributed by SHIGEO MATSU-URA et al to IEEE TRANSACTIONS ON SONICS AND ULTRASONICS, VOL. SU-28, No. 3 (May 1981), pages 156-161, and which has a title of "TV Tuning Systems with SAW Comb Filter".

In order to obtain a desired filtered output signal, the output ports are connected to a filter output terminal through a plurality of switches, respectively. One of the switches is selectively turned on in a conventional surface acoustic wave filter. In other words, the conventional surface acoustic wave filter carries out a switching of filter characteristics by selecting one of the output interdigital tranducers. In general, as the switch is used a PIN diode or a mechanical switch.

With this structure, the number of components is increased as the number of the output ports, namely, of the output interdigital transducers is increased. This will cause problems of reduced reliability and higher costs besides the complicated circuit structure.

In addition, when the surface acoustic wave filter comprises first through n-th output ports where n represents a positive integer which is not less than two, the filtered output signal is outputted from one of the first through the n-th output ports. It will be assumed that each of the first through the n-th output ports has a port reliability Rp, namely, a port Fit number. Under the circumstances, the surface acoustic wave filter has a filter reliability Rf, namely, a filter Fit number which is equal to the port reliability Rp to the n-th power, that is:

$$Rf = Rp^n.$$

As a result, there is another problem that the filter reliability Rf (the filter Fit number) is reduced as the number of the output ports is increased.

SUMMARY OF THE INVENTION

It is therefore an object of this invention to provide a surface acoustic wave filter which is simple in structure.

It is another object of this invention to provide a surface acoustic wave filter of the type described, which maintains a relatively higher filter reliability although the number of output ports is increased.

Other objects of this invention will become clear as the description proceeds.

According to this invention, a surface acoustic wave filter comprises a piezoelectric substrate and an input port supplied with an input electric signal. Mounted on the piezoelectric substrate and connected to the input port, an input interdigital transducer converts the input electric signal into an input surface acoustic wave. The input interdigital transducer makes the piezoelectric substrate propagate the input surface acoustic wave as propagated surface acoustic wave thereon. Mounted on the piezoelectric substrate, a plurality of output interdigital transducers are opposed to the input interdigital transducer apart therefrom. The output interdigital transducers have weighting factors which are different from one another. The output interdigital transducers receive the propagated surface acoustic wave as received surface acoustic waves and converts the received surface acoustic waves into output electric signals. Connected to the output interdigital transducers, a plurality of output ports produce the output electric signals. A filter output terminal is directly connected to one of the output ports. Connected between the filter output terminal and remaining output ports except for the above-mentioned one of the output ports, switching means selectively connects one of the remaining output ports to the filter output terminal to make the filter output terminal produce a filtered output signal which is equal to a sum of at least one of the output electric signals.

DESCRIPTION OF THE PREFERRED EMBODIMENTS

Figure 1:
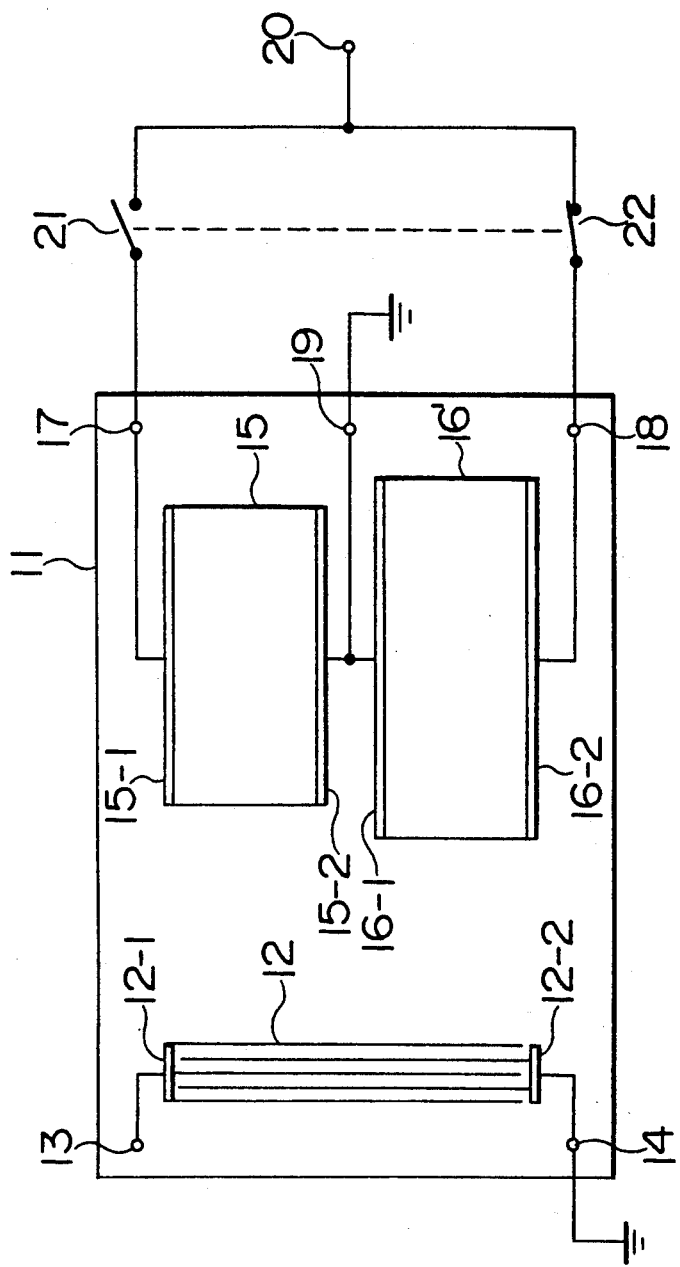
FIG. 1 is a diagram of a conventional surface acoustic wave filter.

Referring to FIG. 1, a conventional surface acoustic wave filter will be described in order to facilitate an understanding of this invention.

The surface acoustic wave filter comprises a piezoelectric substrate 11 which substantially has a quadratic prism shape. On the piezoelectric substrate 11, an input interdigital transducer (IDT) 12 is mounted or formed. The input interdigital transducer 12 comprises a pair of electrodes 12-1 and 12-2 which are opposed to each other. Between the electrodes 12-1 and 12-2, a plurality of electrode digits are disposed along a predetermined direction with the electrode digits intersected one another. On the example being illustrated, the input interdigital transducer 12 has the electrode digits which are equal in number to five and each of which has a uniform length. In other words, each of the electrode digits has a predetermined beam width. The electrode 12-1 of the input interdigital transducer 12 is connected to a first input port 13 while the electrode 12-2 of the input interdigital transducer 12 is connected to a second input port 14. The first input port 13 is supplied with an input electric signal while the second input port 14 is grounded or earthed. The input interdigital transducer 12 converts the input electric signal into an input surface acoustic wave (SAW). The input surface acoustic wave is propagated on a surface of the piezoelectric substrate 11 as a propagated surface acoustic wave along the predetermined direction.

On the piezoelectric substrate 11, first and second output interdigital transducers 15 and 16' are mounted or formed in parallel. Each of the first and the second output interdigital transducers 15 and 16' is opposed to the input interdigital transducer 12 apart therefrom. The propagated surface acoustic wave is received by the first and the second output interdigital transducers 15 and 16' as first and second received surface acoustic waves, respectively. The first output interdigital transducer 15 converts the first received surface acoustic wave into a first output electric signal while the second output interdigital transducer 16' converts the second received surface acoustic wave into a second output electric signal. The first output interdigital transducer 15 comprises a pair of electrodes 15-1 and 15-2 while the second output interdigital transducer 16' comprises a pair of electrodes 16-1 and 16-2. The electrode 15-1 of the first output interdigital transducer 15 and the electrode 16-2 of the second output interdigital transducer 16' are connected to first and second output ports 17 and 18, respectively. The electrode 15-2 of the first output interdigital transducer 15 and the electrode 16-1 of the second output interdigital transducer 16' are connected to each other at a connection point therebetween. The connection point is connected to a common output port 19 as shown in FIG. 1. The common output port 19 is grounded or earthed. The first and the second output ports 17 and 18 produce the first and the second output electric signals, respectively.

Figure 2:
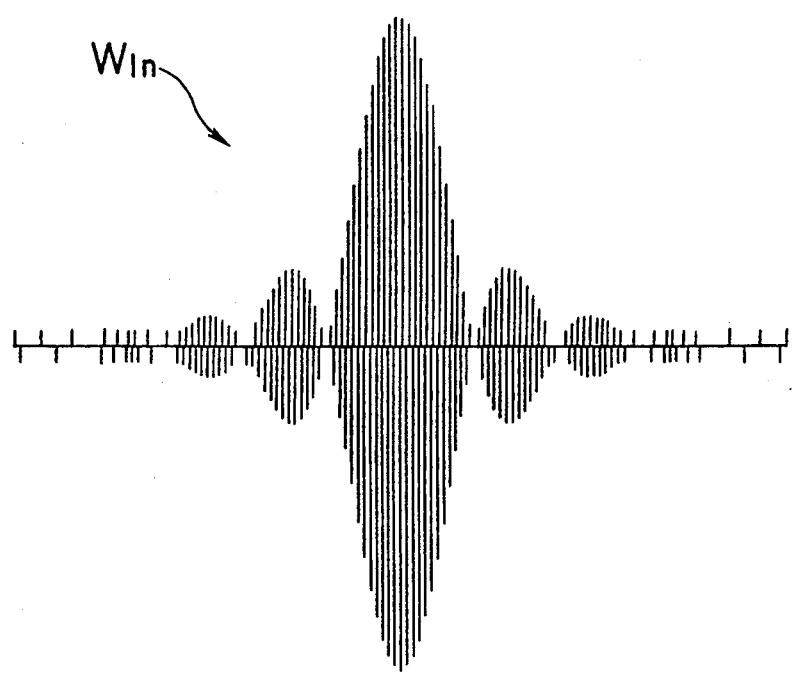
FIG. 2 shows a first weighting factor of a first output interdigital transducer for use in the surface acoustic wave filter illustrated in FIG. 1.
Figure 3:
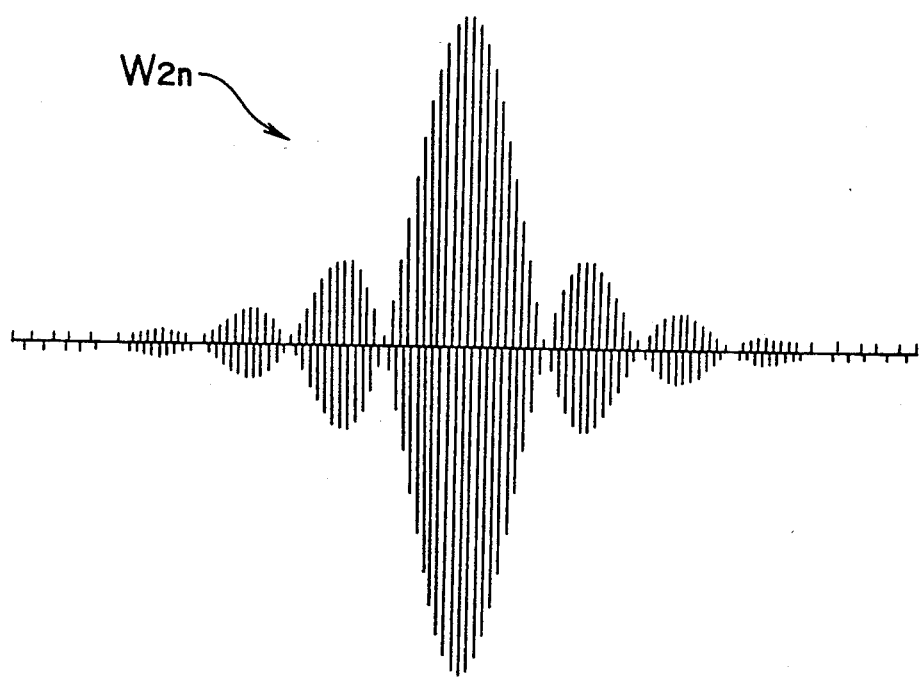
FIG. 3 shows a second weighting factor of a second output interdigital transducer for use in the surface acoustic wave filter illustrated in FIG. 1.

Turning to FIGS. 2 and 3, the first and the second output interdigital transducers 15 and 16' have first and second weighting factors $W_{1n}$ and $W_{2n}$ as shown in FIGS. 2 and 3, respectively. The first weighting factor $W_{1n}$ corresponds to intersection lengths or widths where electrode digits of the first output interdigital transducer 15 intersect. Similarly, the second weighting factor $W_{2n}$ corresponds to intersection lengths where electrode digits of the second output interdigital transducer 16' intersect. A combination of the input interdigital transducer 12 and the first output interdigital transducer 15 is called a first filter having a first filter characteristic $H_1(f)$ while another combination of the input interdigital transducer 12' and the second output interdigital transducer 16' is referred to as a second filter having a second filter characteristic $H_2(f)$.

Figure 4:
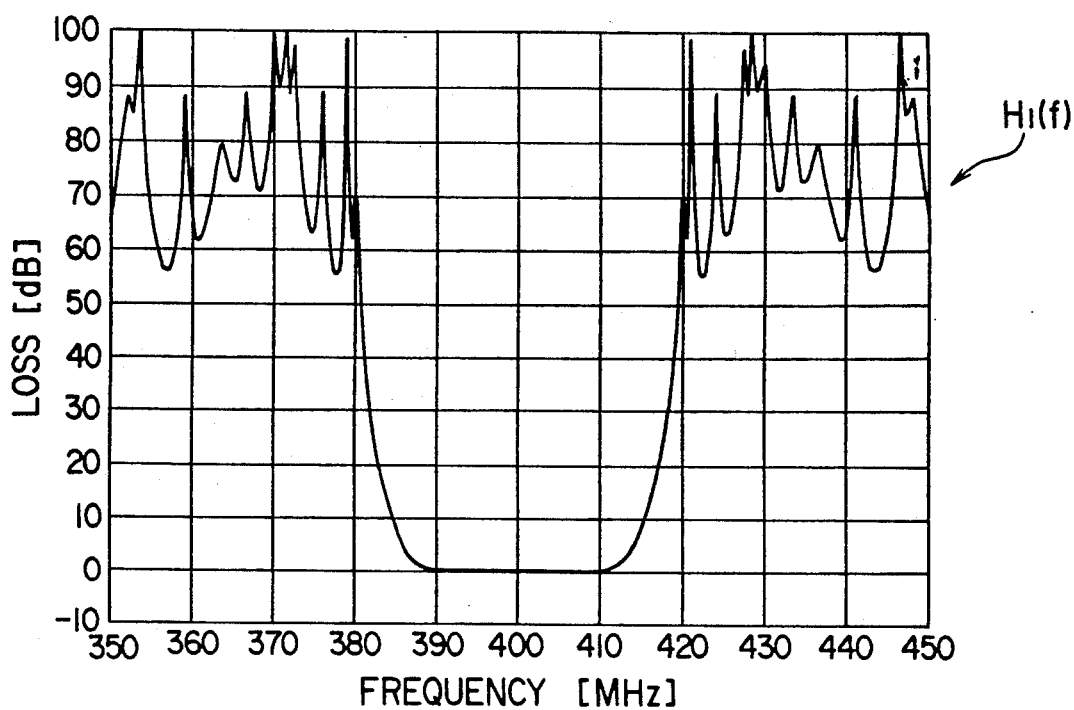
FIG. 4 shows a first filter characteristic of the surface acoustic wave filter illustrated in FIG. 1.

Turning to FIG. 4 attention will be directed to the first filter characteristic $H_1(f)$, namely, a first frequency characteristic as regards a signal transmitted from the input port 13 to the first output port 17. In this connection, the first output interdigital transducer 15 has an electrode digit pitch L which is determined so that the first filter has a central frequency $f_o$ equal to 400 MHz on the basis of a speed v of the propagated surface acoustic wave on the piezoelectric substrate 11.

Figure 5:
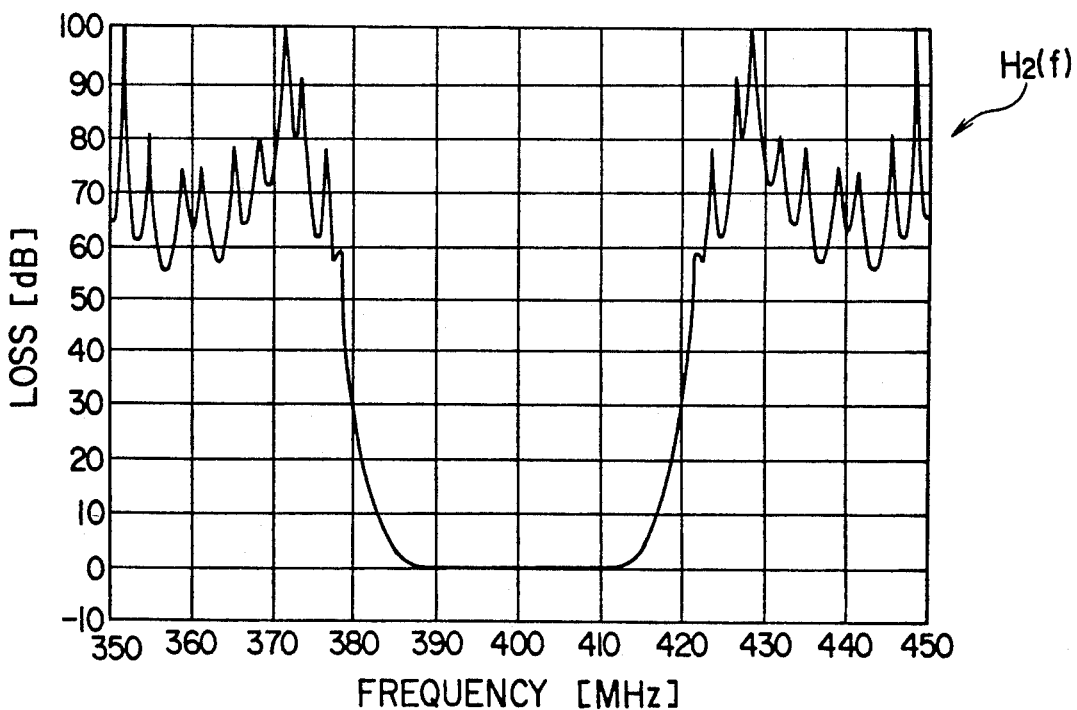
FIG. 5 shows a second filter characteristic of the surface acoustic wave filter illustrated in FIG. 1.

FIG. 5 shows the second filter characteristic $H_2(f)$, namely, a second frequency characteristic as regards a signal transmitted from the input port 13 to the second output port 18.

It will be assumed that the input interdigital transducer 12 has an input frequency characteristic Hi(F) and the first and the second output interdigital transducers 15 and 16' have first and second output frequency characteristics $H_{o1}(f)$ and $H_{o2}(f)$, respectively. In this event, the first and the second filter characteristics $H_1(f)$ and $H_2(f)$ are generally represented by:

$$H_1(f) \propto Hi(f) * H_{o1}(f), \quad (1)$$

$$\text{and } H_2(f) \propto Hi(f) * H_{o2}(f), \quad (2)$$

where the symbol * represents a convolution integral. The first and the second output frequency characteristics $H_{o1}(f)$ and $H_{o2}(f)$ are represented by:

$$H_{o1}(f) \propto \sum_{n=1}^{N} W_{1n}\exp\left(-j\frac{2\pi f}{v}n\frac{L}{2}\right) = \sum_{n=1}^{N} W_{1n}\exp\left(-jn\pi\frac{f}{f_o}\right), \quad (3)$$

and $$H_{o2}(f) \propto \sum_{n=1}^{N} W_{2n}\exp\left(-j\frac{2\pi f}{v}n\frac{L}{2}\right) = \sum_{n=1}^{N} W_{2n}\exp\left(-jn\pi\frac{f}{f_o}\right), \quad (4)$$

where $f_o$ is equal to v/L.

As a result, in the prior art, a switching of filter characteristic is carried out by selecting one of output interdigital transducers having weighting factors which are different from one another.

More specifically, in order to obtain a desired filtered output signal, the first and the second output ports 17 and 18 are connected to a filter output terminal 20 through first and second switches 21 and 22, respectively, as shown in FIG. 1. One of the first and the second switches 21 and 22 is selectively turned on. Accordingly, the conventional surface acoustic wave filter is defective in that it has reduced reliability and higher costs besides the complicated circuit structure, as mentioned in the preamble of the instant specification. In addition, the conventional surface acoustic wave filter is disadvantageous in that it has a reduced filter reliability as the number of the output ports is increased, as also mentioned in the preamble of the instant specification.

Figure 6:
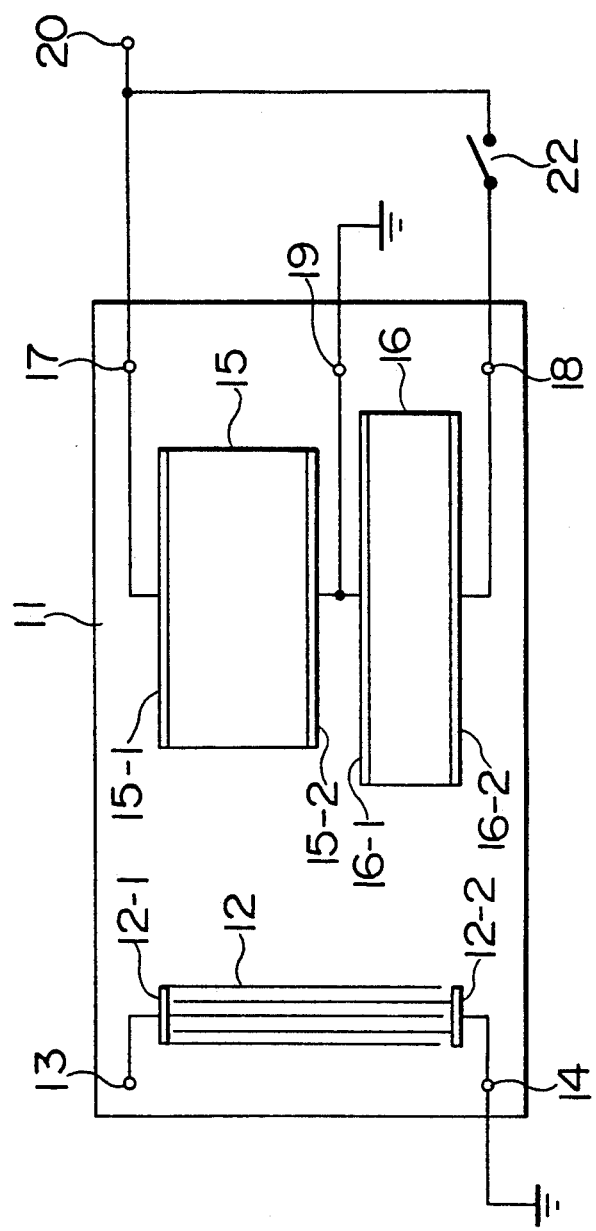
FIG. 6 is a diagram of a surface acoustic wave filter according to a first embodiment of this invention.

Referring to FIG. 6, a surface acoustic wave filter according to a first embodiment of this invention is similar in structure to that illustrated in FIG. 1 except that the second output interdigital transducer is modified in the manner which will later be described and the first switch 21 is omitted. Therefore, the second output interdigital transducer is depicted at 16.

Figure 7:
FIG. 7 shows a difference weighting factor of a second output interdigital transducer for use in the surface acoustic wave filter illustrated in FIG. 6.

The first output port 17 is directly connected to the filter output terminal 20. The second output interdigital transducer 16 has a difference weighting factor $\Delta W_n$ which is shown in FIG. 7 and which is equal to a difference between the first and the second weighting factors $W_{1n}$ and $W_{2n}$, that is:

$$\Delta W_n = W_{2n} - W_{1n}. \quad (5)$$

Accordingly, the second filter characteristic $H_2(f)$ is represented by using the first weighting factor $W_{1n}$ and the difference weighing factor $\Delta W_n$:

$$H_2(f) \propto H_i(f) * \sum_{n=1}^{N} (W_{1n} + \Delta W_n) \exp\left(-jn\pi \frac{f}{f_o}\right), \quad (6)$$

$$= H_i(f) * \left\{ H_{o1}(f) + \sum_{n=1}^{N} \Delta W_n \exp\left(-jn\pi \frac{f}{f_o}\right) \right\}.$$

Equation (6) indicates that the second filter characteristic $H_2(f)$ is represented by a sum of the first filter characteristic $H_1(f)$ and a characteristic according to the difference weighting factor $\Delta W_n$. In this connection, the first weighting factor $W_{1n}$ may be called a primary weighting factor.

Therefore, when the switch 22 is turned off, the filter output terminal 20 produces the filtered output signal depending only on the first output interdigital transducer 15. On the contrary, when the switch 22 is turned on, the filter output terminal 20 produces the filtered output signal which depends on both of the first and the second output interdigital transducers 15 and 16 and which is equal to a sum of the first and the second output electric signals supplied from the first and the second output ports 17 and 18. Thus, in the above-mentioned embodiment, two different filter characteristics can be obtained only by means of controlling ON and OFF of the switch 22. The switch 22 may be, for example, a PIN diode or a mechanical switch. with this structure, it becomes possible to miniaturize the second output interdigital transducer 16, resulting in realization of the low costs.

Figure 8:
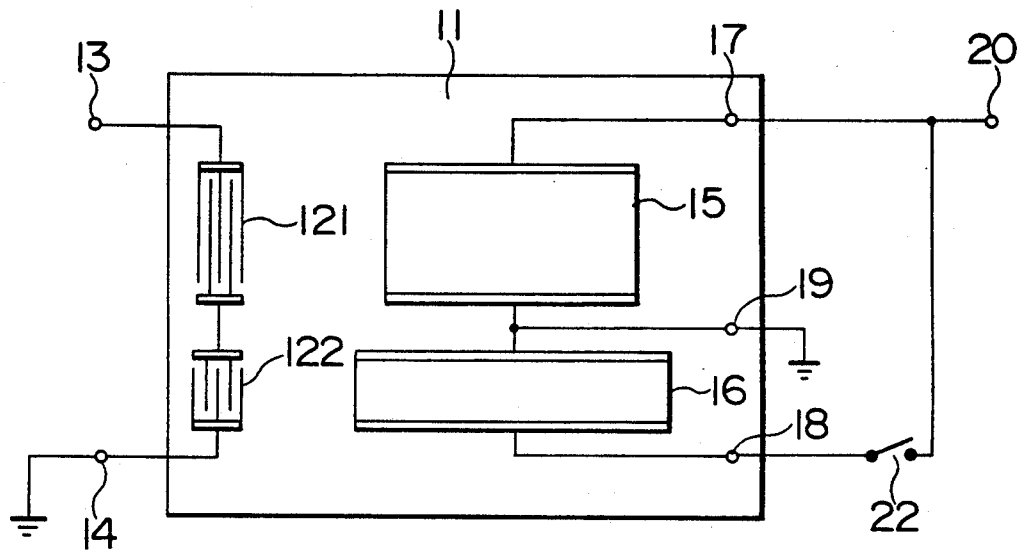
FIG. 8 is a diagram of a surface acoustic wave filter according to a second embodiment of this invention.

Turning to FIG. 8, a surface acoustic wave filter according to a second embodiment of this invention is similar in structure to that illustrated in FIG. 6 except that the input interdigital transducer 12 is divided into first and second partial input interdigital transducers 121 and 122. The first partial input interdigital transducer 121 supplies the surface acoustic wave to the first output interdigital transducer 15 while the second partial input interdigital transducer 122 supplies the surface acoustic wave to the second output interdigital transducer 16. In the example being illustrated, the second input port 14 is grounded or earthed. A third input port may be connected to a connection point between the first and the second partial input interdigital transducers 121 and 122. In this event, the third input port is grounded or earthed while the first and the second input ports are supplied with first and second input electric signals, respectively.

Figure 9:
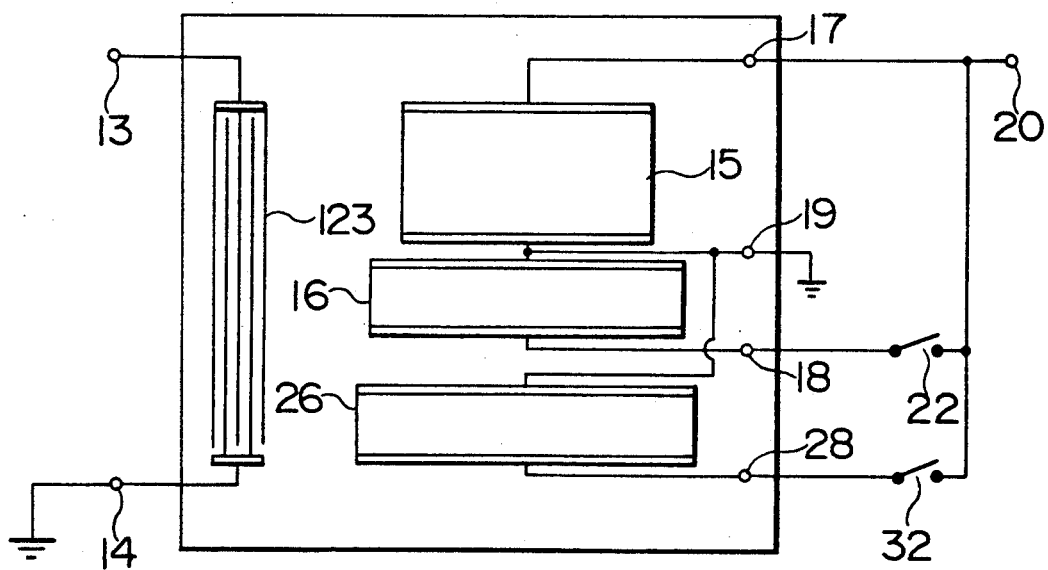
FIG. 9 is a diagram of a surface acoustic wave filter according to a third embodiment of this invention.

Turning to FIG. 9, a surface acoustic wave filter according to a third embodiment of this invention is similar in structure to that illustrated in FIG. 6 except that an additional output interdigital transducer 26, an additional output port 28, and an additional switch 32 are added and the input digital transducer is modified in the manner which will later be described. Therefore, the modified input digital transducer is depicted at 123.

The modified input digital transducer 123 supplies the surface acoustic wave to the first, the second, and the additional output interdigital transducers 15, 16, and 26. With this structure, it is possible to select one of three filter characteristics by turning off both of the switches 22 and 32 or by turning on either the switch 22 or the switch 32. The additional output interdigital transducer 26 is designed by using another difference weighting factor in the similar manner of the second output interdigital transducer 16.

While this invention has thus far been described in conjunction with a few embodiments thereof, it will now be readily possible for those skilled in the art to put this invention into practice in various other manners.

What is claimed is:

1. A surface acoustic wave filter comprising:
   a piezoelectric substrate;
   an input port supplied with an input electric signal;
   an input interdigital transducer mounted on said piezoelectric substrate and connected to said input port for converting said input electric signal into an input surface acoustic wave, said input interdigital transducer making said piezoelectric substrate propagate said input surface acoustic wave as a propagated surface acoustic wave thereon;
   a plurality of output interdigital transducers mounted on said piezoelectric substrate with said output interdigital transducers opposed to said input interdigital transducer apart therefrom, said output interdigital transducers having weighting factors which are different from one another, said output interdigital tranducers receiving said propagated surface acoustic wave as received surface acoustic waves and converting said received surface acoustic waves into output electric signals:
   a plurality of output ports connected to said output interdigital transducers for producing said output electric signals;
   a filter output terminal directly connected to one of said output ports; and
   switching means connected between said filter output terminal and remaining output ports except for said one of said output ports for selectively connecting one of said remaining output ports to said filter output terminal to make said filter output terminal produce a filtered output signal which is equal to a sum of at least one of said output electric signals, wherein one of said output interdigital transducers that is connected to said one of the output ports has a primary weighting factor, each of remaining output interdigital transducers except for said one of the output interdigital transducers having difference weighting factor.

* * * * *